United States Patent
Koiwa

(10) Patent No.: US 12,451,336 B2
(45) Date of Patent: Oct. 21, 2025

(54) SUBSTRATE PROCESSING APPARATUS AND SUBSTRATE PROCESSING METHOD

(71) Applicant: Tokyo Electron Limited, Tokyo (JP)

(72) Inventor: Shingo Koiwa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 455 days.

(21) Appl. No.: 17/990,143

(22) Filed: Nov. 18, 2022

(65) Prior Publication Data

US 2023/0162956 A1   May 25, 2023

(30) Foreign Application Priority Data

Nov. 19, 2021   (JP) .................................. 2021-188695

(51) Int. Cl.
  *H01J 37/32*   (2006.01)
  *H01L 21/683*   (2006.01)

(52) U.S. Cl.
  CPC . *H01J 37/32724* (2013.01); *H01J 2237/2007* (2013.01); *H01J 2237/334* (2013.01); *H01L 21/6833* (2013.01)

(58) Field of Classification Search
  CPC ......... H01J 37/32724; H01J 2237/2007; H01J 2237/334; H01J 37/32715; H01J 37/32532; H01L 21/6833; H01L 21/67103; H01L 21/67109; H01L 21/67248; H01L 21/683; H01L 21/6831; H01L 21/67069

USPC ........................................................ 361/234
See application file for complete search history.

(56) References Cited

U.S. PATENT DOCUMENTS

2016/0225651 A1 *   8/2016   Tran .................. H01L 21/67103

FOREIGN PATENT DOCUMENTS

| JP | H11-251416 A |   | 9/1999 |   |
|----|----|----|----|----|
| JP | H11330218 A | * | 11/1999 |   |
| JP | 2001223259 A | * | 8/2001 |   |
| JP | 2013-016554 A |   | 1/2013 |   |
| JP | 2015099839 A | * | 5/2015 | ......... H01L 21/6833 |
| JP | 2020-017700 A |   | 1/2020 |   |
| JP | 2021166237 A | * | 10/2021 |   |

* cited by examiner

*Primary Examiner* — Sreeya Sreevatsa
(74) *Attorney, Agent, or Firm* — XSENSUS LLP

(57) ABSTRACT

There are provided an electrostatic chuck that attracts a substrate, and includes a dielectric and an attracting electrode for attracting the substrate inside of the dielectric, a heater electrode for heating the substrate, an attracting power source for applying an attraction voltage for attracting the substrate to the attracting electrode, and a heating power source for applying a heater voltage for heating the substrate to the heater electrode, wherein the attracting power source controls a magnitude of the attraction voltage that is applied to the attracting electrode based on a magnitude of the heater voltage.

22 Claims, 10 Drawing Sheets

SUBSTRATE PROCESSING APPARATUS AND SUBSTRATE PROCESSING METHOD

CROSS-REFERENCE TO RELATED APPLICATIONS

This application claims priority to Japanese Patent Application No. 2021-188695, filed on Nov. 19, 2021, the entire contents of which are incorporated herein by reference.

TECHNICAL FIELD

The present disclosure relates to a substrate processing apparatus and a substrate processing method.

BACKGROUND

Patent Document 1 discloses an electrostatic chuck such that a dielectric layer for absorbing a substrate to be processed and a heat insulating plate are stacked, and that an upper surface and a side surface of the dielectric layer of the heat insulating plate are covered with a conductive film for charge escape. According to the electrostatic chuck disclosed in Patent Document 1, the dielectric layer is made of alumina ceramic or the like for attracting the substrate to be processed by using an electrostatic force.

PRIOR ART DOCUMENTS

Patent Documents

Patent Document 1: JP-A-2013-016554

SUMMARY

According to the technique of the present disclosure, a substrate is stably attracted and detached to and from the electrostatic chuck controlled to a high temperature.

An aspect of the present disclosure includes an electrostatic chuck that attracts a substrate, and includes: a dielectric and an attracting electrode for attracting the substrate inside of the dielectric, a heater electrode for heating the substrate; an attracting power source for applying an attraction voltage for attracting the substrate to the attracting electrode; and a heating power source for applying a heater voltage for heating the substrate to the heater electrode, wherein the attracting power source controls a magnitude of the attraction voltage that is applied to the attracting electrode based on a magnitude of the heater voltage.

According to the present disclosure, a substrate can be stably attracted and detached to and from the electrostatic chuck being controlled to a high temperature.

DETAILED DESCRIPTION

In the manufacturing process of a semiconductor device, an etching target layer (for example, a silicon-containing film) formed by laminating on a surface of a semiconductor substrate (hereinafter, simply referred to as a "substrate") is subjected to an etching process using a mask layer (for example, a resist film) in which a pattern is formed in advance as a mask. This etching process is generally performed in a plasma processing apparatus that includes an electrostatic chuck that attracts and holds a substrate by using an electrostatic force.

As the electrostatic chuck described above, as disclosed in Patent Document 1, a Coulomb type electrostatic chuck may be used. Usually, a direct-current voltage is applied to a coulomb type electrostatic chuck, and in order to realize stable attraction and detachment of a substrate, it is required to maintain the volume resistivity of the electrostatic chuck to a desired value or more, for example, 1e+15 cmΩ or more.

Figure 1A:
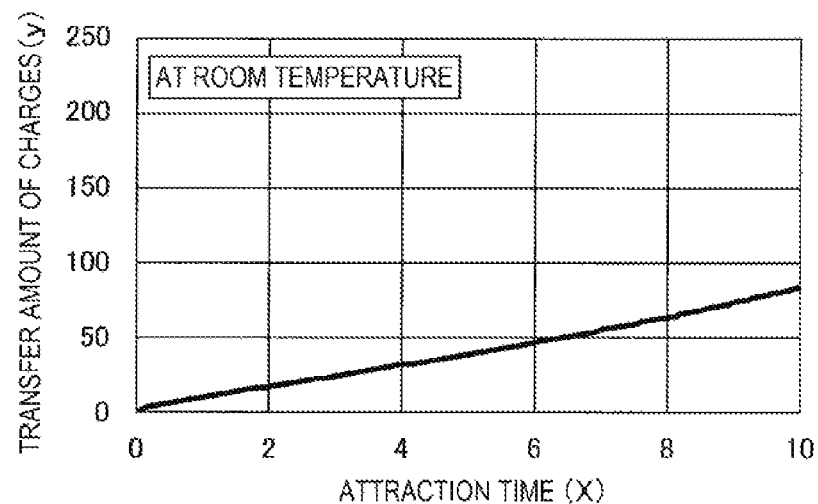
FIG. 1A is a graph illustrating a relationship between the attraction time of a substrate and the transfer amount of charges in a case where an electrostatic chuck is controlled to room temperature.
Figure 1B:
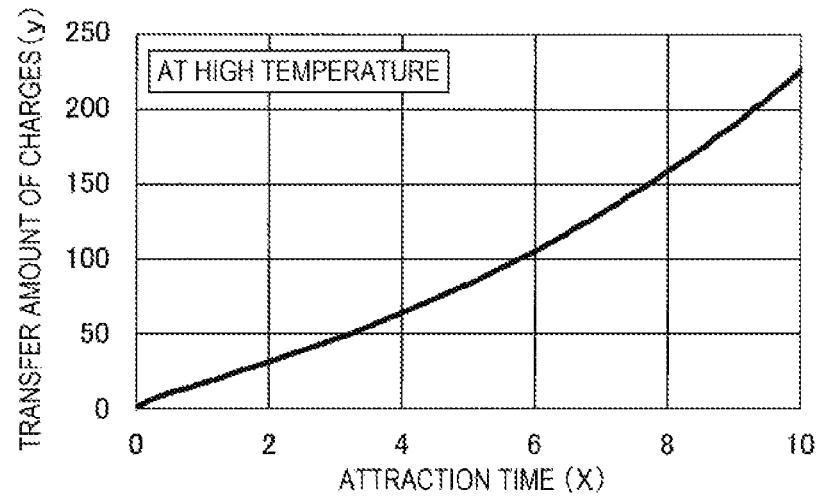
FIG. 1B is a graph illustrating a relationship between the attraction time of the substrate and the transfer amount of charges in a case where the electrostatic chuck is controlled to a high temperature.

In recent years, due to the change of the material of a mask layer, a demand for performing substrate processing while controlling the electrostatic chuck to a high temperature has been increasing. Here, as illustrated in FIG. 1A, since the volume resistivity of the electrostatic chuck is high at room temperature, the transfer amount of charges with respect to the attraction time becomes slow, and the polarization between the substrate and the electrostatic chuck is appropriately maintained. In contrast, as illustrated in FIG. 1B, since the volume resistivity of the electrostatic chuck decreases at a high temperature, the transfer amount of charges with respect to the attraction time becomes steep. As a result, the polarization between the substrate and the electrostatic chuck may not be appropriately maintained, and it may be difficult to make stable attraction and detachment due to the influence of the residual charges. As an example, the influence of such residual charges starts to appear when the temperature of the electrostatic chuck becomes around 200° C., and becomes remarkable when the temperature exceeds 250° C.

As an electrostatic chuck that can cope with a high temperature, there is a Johnson-Rahbek (JR) type electrostatic chuck, and with a JR type electrostatic chuck, it is difficult to control residual attraction; further, the volume resistivity changes considerably with temperature, and thus the room temperature processing and the high temperature processing cannot be consecutively performed. In other words, a conventional electrostatic chuck has room for improvement, and it is required to control an electrostatic chuck such that a substrate can be stably attracted and detached even at a high temperature.

The technique according to the present disclosure has been made in consideration of the above-described circumstances, and a substrate is stably attracted and detached in an electrostatic chuck controlled to a high temperature. Hereinafter, a plasma processing system and a plasma processing method according to the present disclosure will be described with reference to drawings. The same reference numerals will be given to elements having substantially the same functional configurations throughout the specification and the drawings, and redundant description thereof will be omitted.

<Plasma Processing Apparatus>

Figure 2:
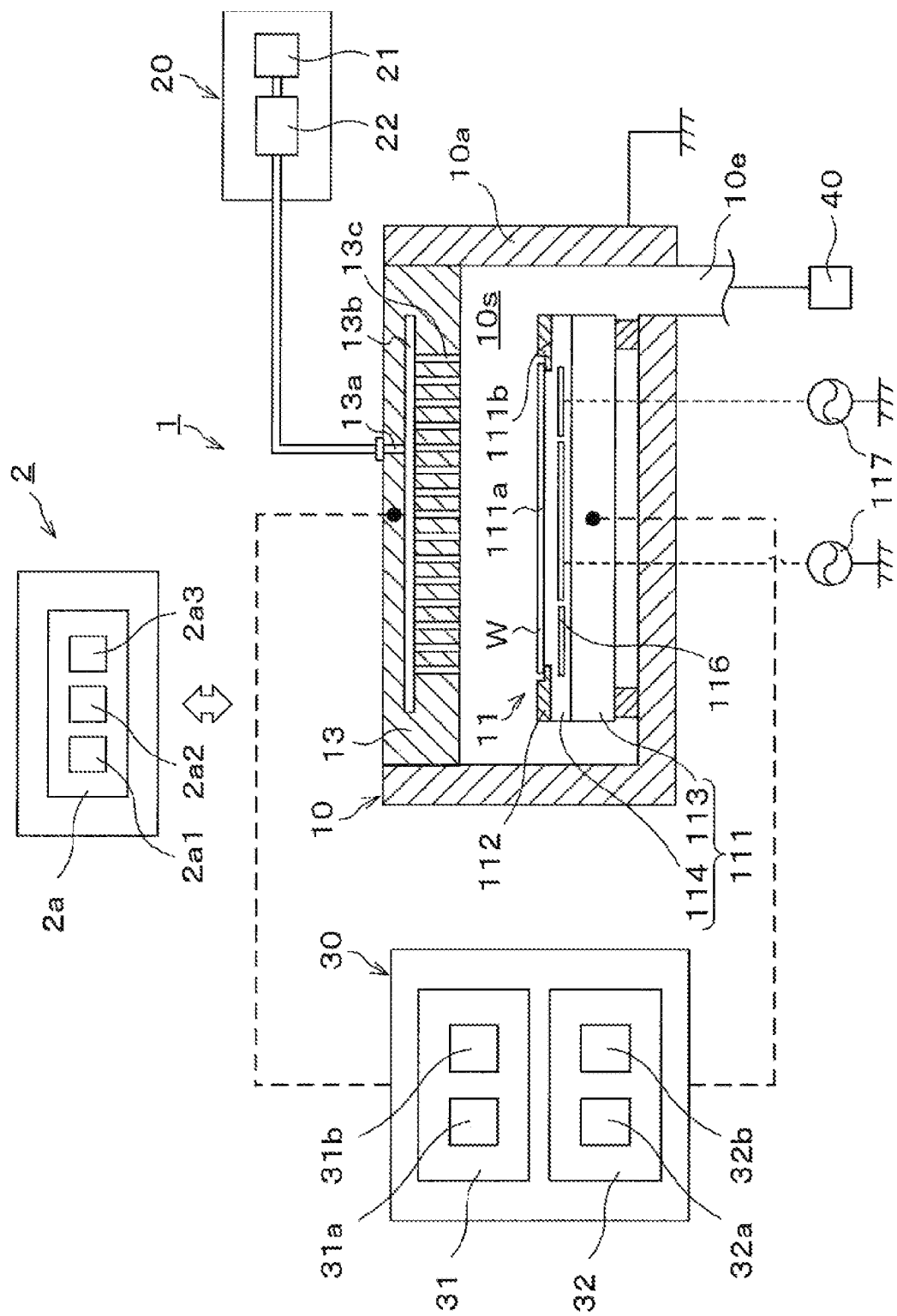
FIG. 2 is a vertical sectional view illustrating an example of a configuration of a plasma processing system according to the present disclosure.

First, a plasma processing system according to the present disclosure will be described. FIG. 2 is a schematic cross-sectional view illustrating an example of the plasma processing system according to the present disclosure.

The plasma processing system includes a capacitively-coupled plasma processing apparatus 1 and a controller 2. A plasma processing apparatus 1 includes a plasma processing chamber 10, a gas supply 20, a power source 30, and an exhaust system 40. Further, the plasma processing apparatus 1 includes a substrate support 11 and a gas introduction unit. The substrate support 11 is disposed inside the plasma processing chamber 10. The gas introduction unit is configured to introduce at least one processing gas into the plasma processing chamber 10. The gas introduction unit includes a shower head 13. The shower head 13 is disposed above the substrate support 11. In one embodiment, the shower head 13 constitutes at least a part of a ceiling of the plasma processing chamber 10. A plasma processing space 10s defined by the shower head 13, a sidewall 10a of the plasma processing chamber 10, and the substrate support 11 is formed inside the plasma processing chamber 10. The plasma processing chamber 10 has at least one gas supply port for supplying at least one processing gas into the plasma processing space 10s, and at least one gas exhaust port for exhausting the gas from the plasma processing space 10s. The plasma processing chamber 10 is grounded, including the sidewall 10a. The shower head 13 and the substrate support 11 are electrically insulated from the plasma processing chamber 10.

The substrate support 11 includes a main body 111 and a ring assembly 112. The main body 111 includes a substrate support surface 111a for supporting a substrate (wafer) W, and a ring support surface 111b for supporting the ring assembly 112. The ring support surface 111b of the main body 111 surrounds the substrate support surface 111a of the main body 111 in a plan view. The substrate W is disposed on the substrate support surface 111a of the main body 111, and the ring assembly 112 is disposed on the ring support surface 111b of the main body 111 to surround the substrate W on the substrate support surface 111a of the main body 111. The main body 111 includes a base 113 and an electrostatic chuck 114. The base 113 includes a conductive member. The conductive member of the base 113 functions as a lower electrode. The electrostatic chuck 114 includes a dielectric such as ceramic and an attracting electrode disposed in the dielectric. The electrostatic chuck 114 is disposed on the base 113. The upper surface of the electrostatic chuck 114 has a substrate support surface 111a. The ring assembly 112 includes one or more annular members. At least one of the one or more annular members is an edge ring. Although not illustrated, the substrate support 11 may include a temperature control module configured to adjust at least one of the electrostatic chuck 114, the ring assembly 112, and the substrate W to a target temperature. The temperature control module includes a heater, a heat transfer medium, and a flow path. A heat transfer fluid, such as brine or gas, flows through the flow path. Further, the substrate support 11 may include a heat transfer gas supply configured to supply a heat transfer gas between the rear surface of the substrate W and the substrate support surface 111a.

The detailed configuration of the substrate support 11 according to the embodiment will be described later.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied from the gas supply 20 to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. The gas introduction unit may include, in addition to the shower head 13, one or a plurality of side gas injectors (SGI) that are attached to one or a plurality of openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power), such as the source RF signal and the bias RF signal, to the conductive member (lower electrode) of the substrate support 11 and/or the conductive member (upper electrode) of the shower head 13. As a result, plasma is formed from at least one processing gas supplied into the plasma processing space 10s. Accordingly, the RF power source 31 may function as at least a portion of a plasma generator configured to generate plasma from one or more processing gases in the plasma processing chamber 10. Further, by supplying the bias RF signal to the lower electrode, a bias potential can be generated in the substrate W to draw an ionic component in the formed plasma to the substrate W.

In one embodiment, the RF power source 31 includes a first RF generator 31a and a second RF generator 31b. The first RF generator 31a is configured to be coupled to the lower electrode and/or the upper electrode via at least one impedance matching circuit to generate a source RF signal (source RF power) for plasma generation. In one embodiment, the source RF signal has a frequency in the range of 13 MHz to 150 MHz. In one embodiment, the first RF generator 31a may be configured to generate a plurality of source RF signals having different frequencies. The one or the plurality of source RF signals generated are supplied to the lower electrode and/or the upper electrode. The second RF generator 31b is configured to be coupled to the lower electrode via at least one impedance matching circuit to generate the bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31b may be configured to generate a plurality of bias RF signals having different frequencies. The one or the plurality of bias RF signals generated are supplied to the lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is configured to be connected to the lower electrode and to generate the first DC signal. The generated first DC signal is applied to the lower electrode. In one embodiment, the first DC signal may be applied to another electrode, such as an electrode in an electrostatic chuck. In one embodiment, the second DC generator 32b is configured to be connected to the upper electrode to generate a second DC signal. The generated second DC signal is applied to the upper electrode. In various embodiments, at least one of the first and second DC signals may be pulsed. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure inside the plasma processing space 10s is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2a. For example, the computer 2a may include a processor (central processing unit (CPU)) 2a1, a storage 2a2, and a communication interface 2a3. The processor 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

While various exemplary embodiments have been described above, various additions, omissions, substitutions and changes may be made without being limited to the exemplary embodiments described above. Indeed, the embodiments described herein may be embodied in a variety of other forms.

<Substrate Support According to First Embodiment>

Figure 3A:
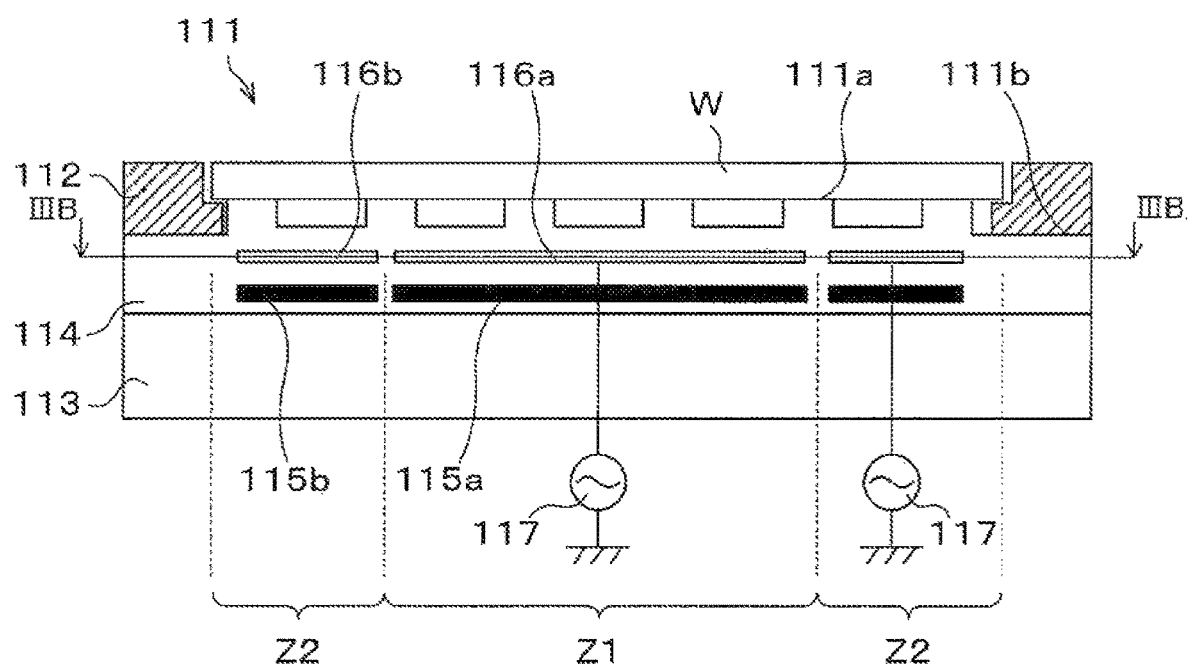
FIG. 3A is a vertical sectional view illustrating a schematic configuration of a substrate support according to a first embodiment.
Figure 3B:
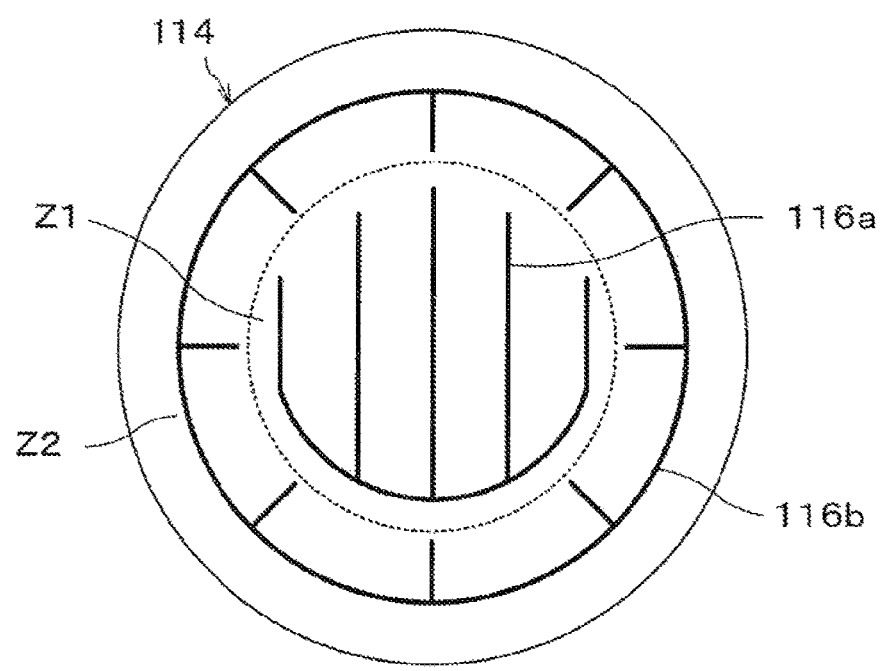
FIG. 3B is a cross-sectional view illustrating a schematic configuration of the substrate support according to the first embodiment.

Hereinafter, a configuration of a substrate support according to a first embodiment will be described. FIG. 3A is a vertical sectional view illustrating an example of a configuration of a substrate support 11 according to a first embodiment. FIG. 3B is a cross-sectional view taken along a line IIIB-IIIB in FIG. 3A.

Inside of the electrostatic chuck 114, a central heater electrode 115a and a peripheral heater electrode 115b are provided to be configured to adjust at least the electrostatic chuck 114 to a target temperature. Further, inside of the electrostatic chuck 114, a central attracting electrode 116a and a peripheral attracting electrode 116b for attracting and holding the substrate W onto the substrate support surface 111a are provided on the upper surface side (the substrate W side) of the central heater electrode 115a and the peripheral heater electrode 115b. The electrostatic chuck 114 is configured as a Coulomb type electrostatic chuck in which the central heater electrode 115a, the peripheral heater electrode 115b, the central attracting electrode 116a, and the peripheral attracting electrode 116b are interposed between dielectrics.

As illustrated in FIG. 3B, the substrate support surface 111a of the electrostatic chuck 114 includes a first temperature control region Z1 formed inward in the radial direction and a second temperature control region Z2 formed to surround the first temperature control region Z1 in a plan view.

The central heater electrode 115a is provided below the central attracting electrode 116a (IIIB-IIIB cross-section) at a position corresponding to the first temperature control region Z1 (the base 113 side). Further, the peripheral heater electrode 115b is provided below the peripheral attracting electrode 116b (IIIB-IIIB cross-section) and at a position corresponding to the second temperature control region Z2. That is, the electrostatic chuck 114 of the first embodiment is configured to adjust the temperature of the substrate W independently for each of a plurality of temperature control regions Z (for each of the two temperature control regions Z in the example illustrated in FIG. 3A).

In an example, a heating power source (not illustrated) is connected to each of the central heater electrode 115a and the peripheral heater electrode 115b, and a heater voltage is applied from each of the heating power sources to each heater electrode. In another example, a single heating power source is connected to the central heater electrode 115a and the peripheral heater electrode 115b, and a heater voltage is applied from the heating power source to each heater electrode. In either case, the heater voltages applied from the heating power source to the central heater electrode 115a and the peripheral heater electrode 115b are configured to be independently controllable. Then, the central heater electrode 115a and the peripheral heater electrode 115b are heated by the application of the heater voltage from the heating power source, and thus the substrate W held on the electrostatic chuck 114 and the substrate support surface 111a is heated.

The central attracting electrode 116a is provided corresponding to the first temperature control region Z1. Further, the peripheral attracting electrode 116b is provided corresponding to the second temperature control region Z2. That is, the electrostatic chuck 114 of the first embodiment is configured such that the attraction voltage of the substrate W is independently applicable to each of the plurality of temperature control regions Z (each of the two temperature control regions Z in the examples illustrated in FIGS. 3A and 3B).

In an example, an attracting power source 117 is connected to each of the central attracting electrode 116a and the peripheral attracting electrode 116b, and an attraction voltage is applied from each attracting power source to each attracting electrode. In another example, the single attracting power source 117 is connected to the central attracting electrode 116a and the peripheral attracting electrode 116b, and an attraction voltage is applied from the attracting power source 117 to each attracting electrode. In either case, the attraction voltages applied from the attracting power source 117 to the central attracting electrode 116a and the peripheral attracting electrode 116b are configured to be independently controllable. Then, the substrate W is attracted and held onto the substrate support surface 111a by an electrostatic force to be generated by the application of the attraction voltage from the attracting power source 117.

<Processing Method of Substrate by Plasma Processing Apparatus>

Next, an example of the processing method of the substrate W in the plasma processing apparatus 1 configured as described above will be described. In the plasma processing apparatus 1, the substrate W is subjected to an etching process, for example, using a mask layer in which a pattern is formed in advance as a mask. In the present embodiment, the temperature of the electrostatic chuck 114 is raised to a target temperature (for example, 200° C. or more) before or after the substrate W is placed.

First, the substrate W is carried into the plasma processing chamber 10, and the substrate W is placed on the electrostatic chuck 114 of the substrate support 11. Next, an alternating-current voltage is applied to the central attracting electrode 116a and the peripheral attracting electrode 116b of the electrostatic chuck 114, and the substrate W is attracted and held onto the electrostatic chuck 114 by an electrostatic force to be thus generated. The method of holding the substrate W by the electrostatic chuck 114 will be described in detail later.

When the substrate W is attracted and held onto the electrostatic chuck 114, the inside of the plasma processing chamber 10 is decompressed to a predetermined vacuum level. Further, the processing gas is supplied from the gas supply 20 to the plasma processing space 10s via the shower head 13. Further, the source RF power for generating plasma is supplied from the first RF generator 31a to the conductive member of the substrate support 11, thereby exciting the processing gas to generate plasma. At this time, the bias RF power may be supplied from the second RF generator 31b. Then, in the plasma processing space 10s, the substrate W is subjected to an etching process by the action of the generated plasma.

When the plasma processing is ended, the supply of the source RF power from the first RF generator 31a and the supply of the processing gas from the gas supply 20 are stopped. In a case where the bias RF power is supplied during the plasma processing, the supply of the bias RF power is also stopped.

Next, the attraction and holding of the substrate W by the electrostatic chuck 114 is stopped, and the charge neutralization of the substrate W and the electrostatic chuck 114 after the plasma processing is performed. Thereafter, the substrate W is detached from the electrostatic chuck 114, and the substrate W is carried out from the plasma processing apparatus 1. In this way, a series of plasma processing is completed.

<Method of Holding Substrate by Substrate Support of First Embodiment>

In the plasma processing apparatus 1, plasma processing is performed on the substrate W as described above. Next, the method of holding the substrate W by the electrostatic chuck 114 described above will be described in detail.

Figure 4A:
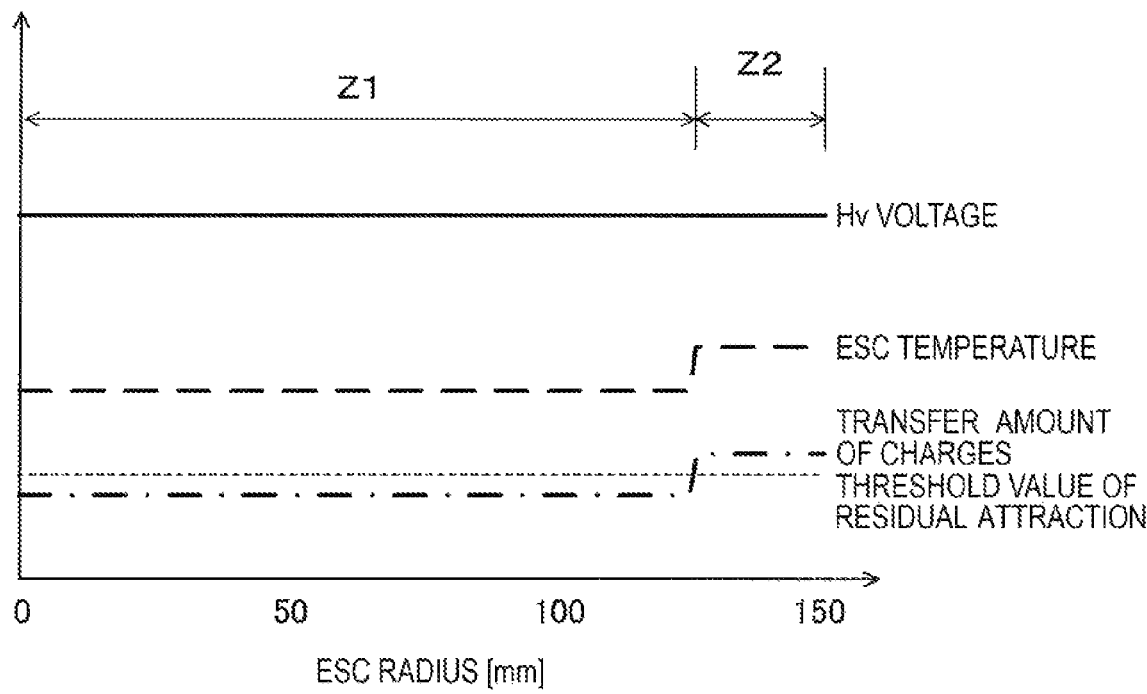
FIG. 4A is a graph illustrating a relationship between the temperature of the electrostatic chuck and the transfer amount of charges in a case where an attraction voltage is constant in the radial direction of the electrostatic chuck.

In the substrate support 11 according to the present embodiment, the temperatures of the two temperature control regions Z1 and Z2 of the electrostatic chuck 114 are controlled independently of each other as described above. At this time, when the temperature of the electrostatic chuck 114 is set to a high temperature, the volume resistivity of the electrostatic chuck 114 decreases as described above. Therefore, as illustrated in FIG. 4A, the transfer amount of charges in the region (in the illustrated example, the peripheral portion of the substrate W) where the temperature of the electrostatic chuck 114 is high increases compared with the transfer amount of charges in the region (in the illustrated example, the central portion of the substrate W) where the temperature is low. As a result, stable attraction and detachment of the substrate W may be lost.

Figure 4B:
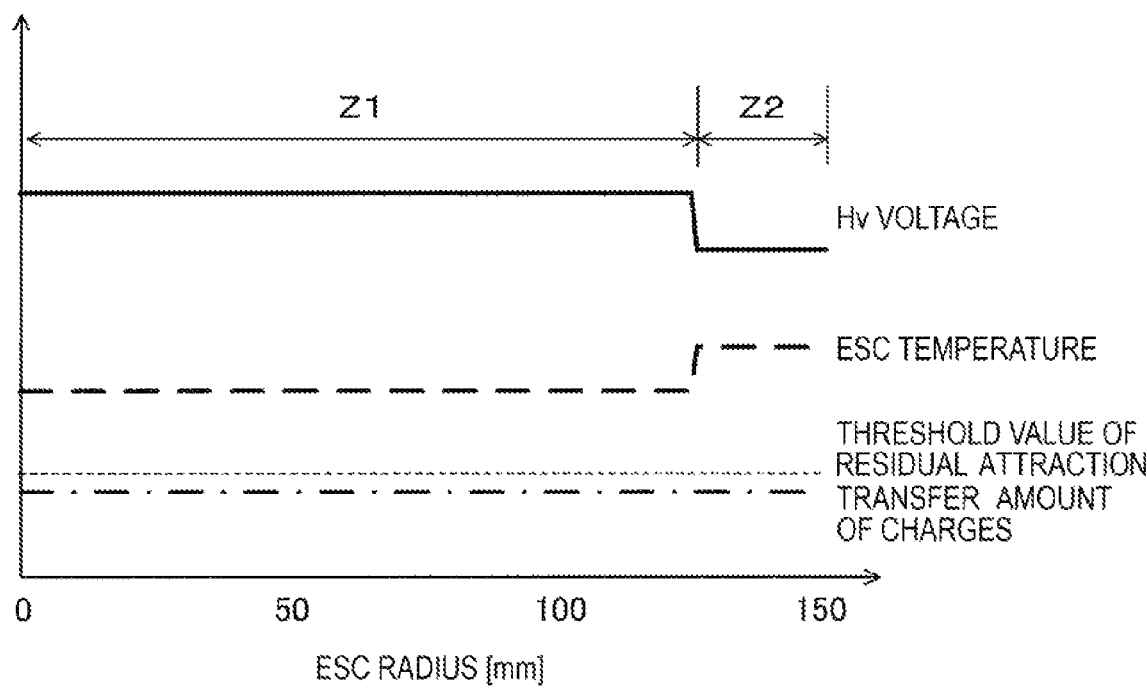
FIG. 4B is a graph illustrating a relationship between the temperature of the electrostatic chuck and the transfer amount of charges in a case where the attraction voltage is changed in the radial direction of the electrostatic chuck.

To cope with such a drawback, in the present embodiment, the transfer amount of charges in the electrostatic chuck 114 is controlled by adjusting the attraction voltage applied to the central attracting electrode 116a and the peripheral attracting electrode 116b according to the temperature of the electrostatic chuck 114. For example, as illustrated in FIG. 4B, the attraction voltage applied to the peripheral attracting electrode 116b in the second temperature control region Z2 where the temperature of the electrostatic chuck 114 is high is lowered as compared with the attraction voltage applied to the central attracting electrode 116a, whereby the transfer amount of charges is maintained to be substantially constant, and the occurrence of residual attraction is suppressed.

As described above, the temperature of the electrostatic chuck 114 is controlled by the heater voltage that is applied from the heating power source to the central heater electrode 115a and the peripheral heater electrode 115b. Therefore, instead of the temperature of the electrostatic chuck 114, the voltage applied to the central attracting electrode 116a and the peripheral attracting electrode 116b may be adjusted according to the voltage applied to the central heater electrode 115a and the peripheral heater electrode 115b.

Further, the following configuration is acceptable: the correlation between the temperature of the electrostatic chuck 114 and the attraction voltage applied to the central attracting electrode 116a and the peripheral attracting electrode 116b is obtained in advance, and the attraction voltage applied to the central attracting electrode 116a and the peripheral attracting electrode 116b is controlled based on the correlation. Further, for example, the temperature of the electrostatic chuck 114 may be measured over time during the plasma processing, and the attraction voltage applied to the central attracting electrode 116a and the peripheral attracting electrode 116b may be feedback-controlled according to the measured temperature.

<Operations and Effects of Technique According to First Embodiment>

In the plasma processing apparatus 1 according to the first embodiment described above, the attraction voltage applied from the attracting power source 117 to the central attracting electrode 116a and the peripheral attracting electrode 116b is controlled according to the temperature of the electrostatic chuck 114 in the substrate support 11. Accordingly, the increase in the transfer amount of charges caused by the increase in the temperature of the electrostatic chuck 114 is suppressed, and the transfer amount of charges is lowered below a threshold value that takes a risk occurrence of the residual attraction.

At this time, control is performed such that the transfer amount of charges between the substrate W and the central attracting electrode 116a or the peripheral attracting electrode 116b is uniform (constant) and lower than the threshold value that takes a risk of occurrence of the residual attraction in the entire surface of the electrostatic chuck 114 (the substrate W), whereby the substrate W can be more stably attracted and detached. The threshold value that takes a risk of occurrence of the residual attraction may be experimentally obtained in advance, or may be obtained by simulation or the like.

Further, according to the first embodiment, as illustrated in FIG. 3, an attraction voltage can be independently applied to each of the central attracting electrode 116a and the peripheral attracting electrode 116b. Accordingly, it is possible to apply thereto the attraction voltage according to the temperature of each of the temperature control regions of the electrostatic chuck 114, and it is possible to more stably attract and detach the substrate W while lowering the risk of occurrence of the residual attraction.

In the above embodiment, the case where the electrostatic chuck 114 is divided into two temperature control regions Z in a plan view has been described by way of example; however, the number of divided temperature control regions Z is not limited thereto, and the electrostatic chuck 114 may be divided into three or more temperature control regions. In this case, an attracting electrode may be disposed for each temperature control region Z.

Figure 5:
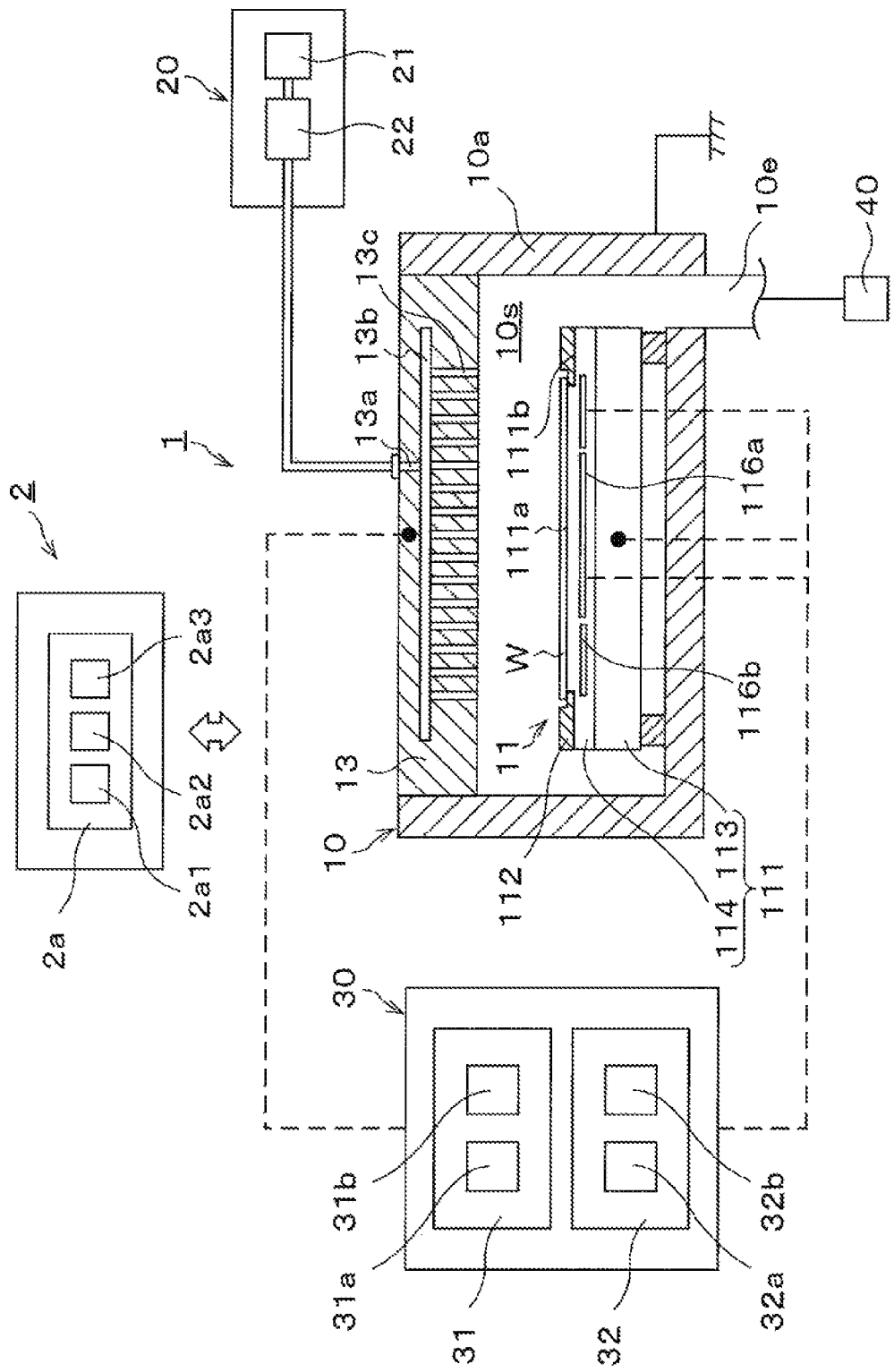
FIG. 5 is an explanatory view illustrating an example of a configuration of a plasma processing system according to another embodiment.

In the embodiment described above, the case where the alternating-current voltage is applied from the attracting power source 117 to the central attracting electrode 116a and the peripheral attracting electrode 116b has been described by way of example; however, instead of this, as illustrated in FIG. 5, a direct-current voltage may be applied from the DC power source 32 to the central attracting electrode 116a and the peripheral attracting electrode 116b.

<Substrate Support According to Second Embodiment>

Next, a configuration of a substrate support according to a second embodiment will be described with reference to drawings. In the substrate support according to the second embodiment, elements having substantially the same functions as those of the substrate support 11 illustrated in FIGS. 3A and 3B are denoted by the same reference numerals, and descriptions thereof will be simplified or omitted.

Figure 6A:
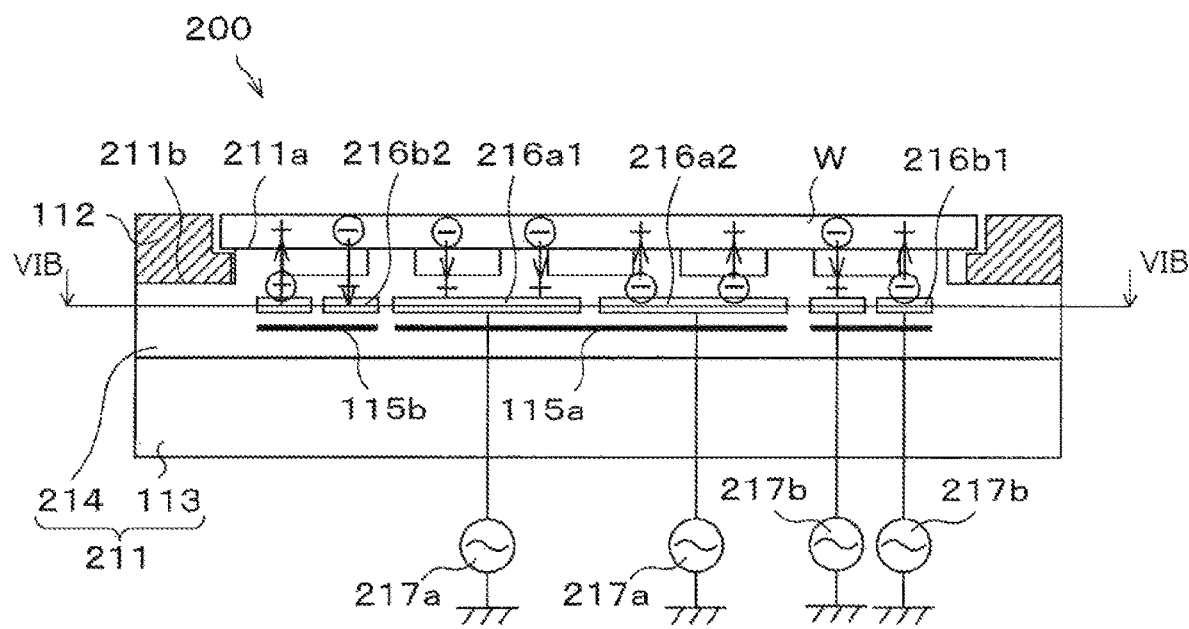
FIG. 6A is a vertical sectional view illustrating a schematic configuration of a substrate support according to a second embodiment.

FIG. 6A is a vertical sectional view illustrating an example of a configuration of a substrate support 200 according to the second embodiment. The substrate support 200 includes a main body 211 and a ring assembly 112. The upper surface of the main body 211 includes a substrate support surface 211a for supporting the substrate W, and a ring support surface 211b for supporting the ring assembly 112. The ring support surface 211b surrounds the substrate support surface 211a in a plan view. The main body 211 includes a base 113 and an electrostatic chuck 214. The electrostatic chuck 214 is disposed on the base 113. The upper surface of the electrostatic chuck 214 includes a substrate support surface 211a and a ring support surface 211b. Inside of the electrostatic chuck 214, at least a central heater electrode 115a and a peripheral heater electrode 115b are provided to be configured to adjust the electrostatic chuck 214 to a target temperature. Further, inside of the electrostatic chuck 214, provided are a central attracting electrode 216a for attracting and holding the substrate W onto the substrate support surface 211a, and a peripheral attracting electrode 216b for attracting and holding the ring assembly 112 onto the ring support surface 211b.

Figure 6B:
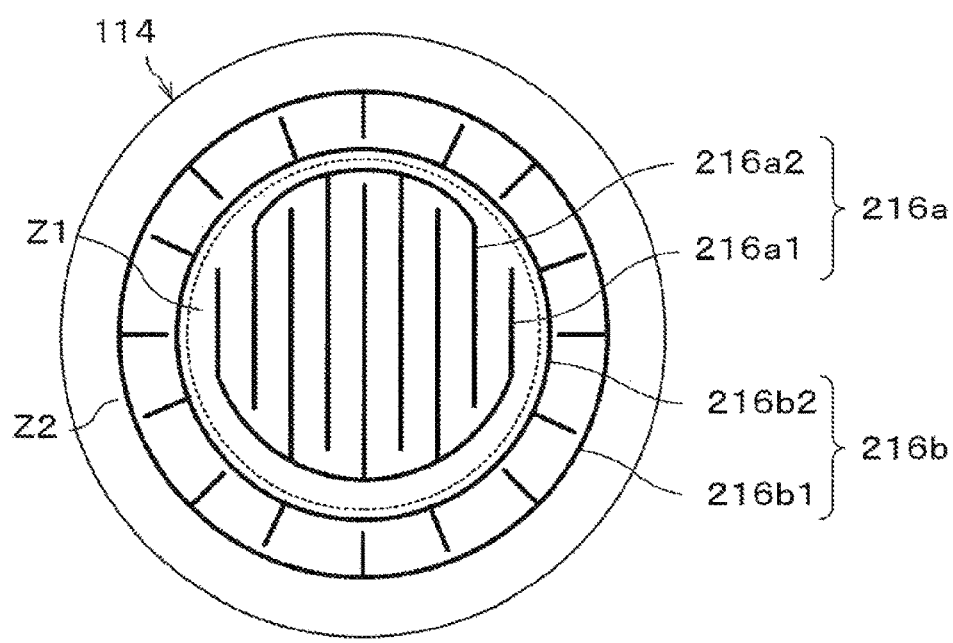
FIG. 6B is a cross-sectional view illustrating a schematic configuration of the substrate support according to the second embodiment.

FIG. 6B is a cross-sectional view taken along a line VIB-VIB in FIG. 6A. In an example, the central attracting electrode 216a includes a first central attracting electrode 216a1 and a second central attracting electrode 216a2 which are alternately disposed in the first temperature control region Z1. Further, the peripheral attracting electrode 216b includes a first peripheral attracting electrode 216b1 and a second peripheral attracting electrode 216b2 that are alternately disposed in the second temperature control region Z2. That is, the electrostatic chuck 214 in the second embodiment is configured as a Coulomb-type bipolar electrostatic chuck configured to attract the substrate W independently for each of the plurality of temperature control regions Z in a plan view, and of two temperature control regions Z in the examples of FIGS. 6A and 6B.

An attraction voltage is applied from the attracting power source 217a of the substrate W to the first central attracting electrode 216a1 and the second central attracting electrode 216a2, and an attraction voltage is applied from the attracting power source 217b of the substrate W to the first central attracting electrode 216b1 and the second central attracting electrode 216b2. In an example, the attracting power sources 217a and 217b are AC power sources. The waveforms of the voltages applied from the attracting power sources 217a and 217b to the first central attracting electrode 216a1 and the second central attracting electrode 216a2 may be a sine wave or a rectangular wave, or may be other waveforms. The attraction voltages applied from the attracting power source 217a to the first central attracting electrode 216a1 and the second central attracting electrode 216a2 are configured to be independently controllable. Further, the attraction voltages applied from the attracting power source 217b to the first peripheral attracting electrode 216b1 and the second peripheral attracting electrode 216b2 are configured to be independently controllable. Then, in the electrostatic chuck 214, the substrate W is attracted and held onto the substrate support surface 211a by an electrostatic force to be generated by the application of the attraction voltage from the attracting power source 217.

In the present embodiment, as described above, the attracting power source 217a is connected to the first central attracting electrode 216a1 and the second central attracting electrode 216a2, and the attracting power source 217b is connected to the first peripheral attracting electrode 216b1 and the second peripheral attracting electrode 216b2, whereby the attraction voltage is independently applied to the corresponding electrode; however, the number of the attracting power sources 217 provided in the plasma processing apparatus 1 is not limited thereto. For example, the first central attracting electrode 216a1 and the second central attracting electrode 216a2 may be connected to the same attracting power source 217a, and the first peripheral attracting electrode 216b1 and the second peripheral attracting electrode 216b2 may be connected to the same attracting power source 217b. Further, for example, each of the first central attracting electrode 216a1, the second central attracting electrode 216a2, the first peripheral attracting electrode 216b1, and the second peripheral attracting electrode 216b2 may be connected to the same attracting power source.

In the substrate support 200 according to the present embodiment, the magnitudes of the attraction voltages applied from the attracting power source 217a to the first central attracting electrode 216a1 and the second central attracting electrode 216a2 periodically change, and the phase of the attraction voltage applied to the first central attracting electrode 216a1 is different from the phase of the attraction voltage applied to the second central attracting electrode 216a2. Further, the magnitudes of the attraction voltages applied from the attracting power source 217b to the first peripheral attracting electrode 216b1 and the second peripheral attracting electrode 216b2 periodically change, and the phase of the attraction voltage applied to the first peripheral attracting electrode 216b1 is different from the phase of the attraction voltage applied to the second peripheral attracting electrode 216b2. The application of the attraction voltages from the attracting power sources 217a and 217b is controlled by the controller 2. In the following description, the first central attracting electrode 216a1 and the first peripheral attracting electrode 216b1 correspond to the "first attracting electrode" according to the technique of the present disclosure, and the second central attracting electrode 216a2 and the second peripheral attracting electrode 216b2 respectively correspond to the "second attracting electrode" according to the technique of the present disclosure.

Further, in the following description, a case where an alternating-current voltage is applied from the attracting power source 217a to the first central attracting electrode 216a1 and the second central attracting electrode 216a2 will be described by way of example; however, a case where the alternating-current voltage is applied from the attracting power source 217b to the first peripheral attracting electrode 216b1 and the second peripheral attracting electrode 216b2 can also be performed in the same manner.

Figure 6C:
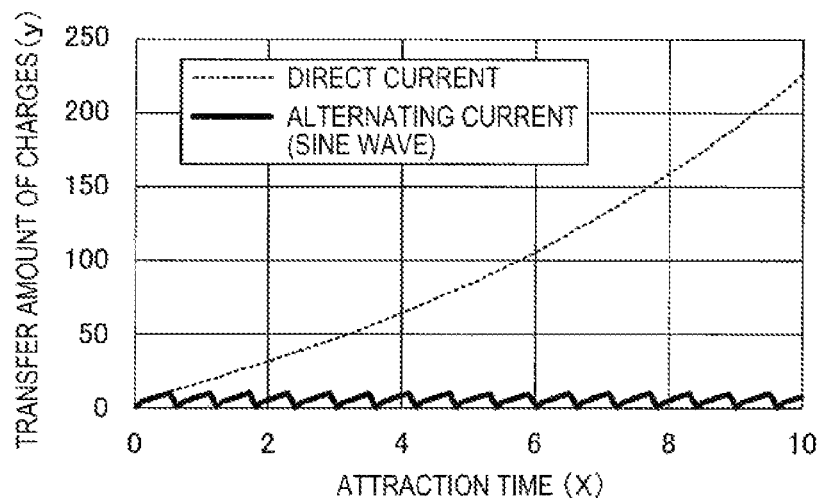
FIG. 6C is an explanatory view illustrating a relationship between the attraction time and the transfer amount of charges in a case where a direct-current voltage is applied to an attracting electrode of the electrostatic chuck and in a case where an alternating-current voltage is applied thereto.

FIG. 6C is a graph illustrating a relationship between the attraction time (horizontal axis) and the transfer amount of charges (vertical axis) in a case where the electrostatic chuck 214 is controlled to a high temperature. In FIG. 6C, the solid line represents the relationship between the attraction time and the transfer amount of charges in a case where an alternating-current voltage is applied to the first central attracting electrode 216a1 and the second central attracting electrode 216a2 of the electrostatic chuck 214. Further, in FIG. 6C, the dotted line represents the relationship between the attraction time and the transfer amount of charges in a case where a direct-current voltage is applied to the first central attracting electrode 216a1 and the second central attracting electrode 216a2 of the electrostatic chuck 214.

As described above, in a case where the electrostatic chuck 214 is controlled to a high temperature, the volume resistivity of the electrostatic chuck 214 decreases. Therefore, in a case where a direct-current voltage is applied to the first central attracting electrode 216a1 and the second central attracting electrode 216a2 of the electrostatic chuck 214, the transfer amount of charges increases over time, so that attraction and holding of the substrate W may be lost. In contrast, in a case where an alternating-current voltage is applied to the first central attracting electrode 216a1 and the second central attracting electrode 216a2 of the electrostatic chuck 214, the polarity of the attraction voltage periodically changes, and thus the transfer amount of charges is reset each time. As a result, it is possible to suppress the unstable attraction and holding of the substrate W due to the increase in the transfer amount of charges.

Figure 7A:
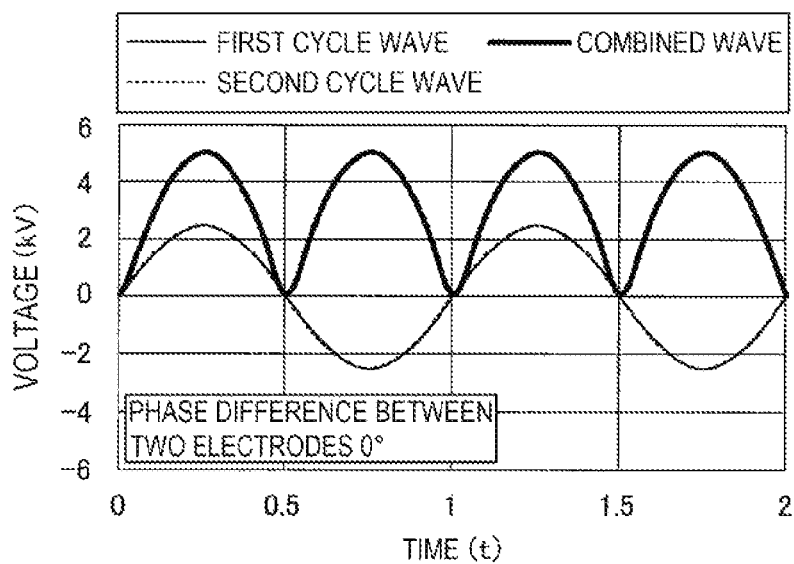
FIG. 7A is a graph illustrating a relationship between a time and an attraction voltage in a case where a phase difference of the attraction voltage applied to each attracting electrode is 0° in the substrate support of the second embodiment.

Here, as illustrated in FIG. 7A, in a case where the alternating-current voltage A applied to the first central attracting electrode 216a1 is in phase (with a phase difference of 0°) with the alternating-current voltage B applied to the second central attracting electrode 216a2, there is a timing such that the total voltage applied to the two attracting electrodes becomes 0 V, and at this timing, the substrate W may be detached from the electrostatic chuck 214. Therefore, in the second embodiment, the detaching of the substrate W from the electrostatic chuck 214 is suppressed by applying to the first central attracting electrode 216a1 an alternating-current voltage A having a phase different from the phase of an alternating-current voltage B that is applied to the second central attracting electrode 216a2.

FIGS. 7B to 7E are graphs illustrating a relationship between time (horizontal axis) and voltage (vertical axis) in a case where an alternating-current voltage A having a phase difference of 30°, 60°, 90°, or 180° from the alternating-current voltage B that is applied to the second central attracting electrode 216a2 is applied to the first central attracting electrode 216a1.

Figure 7B:
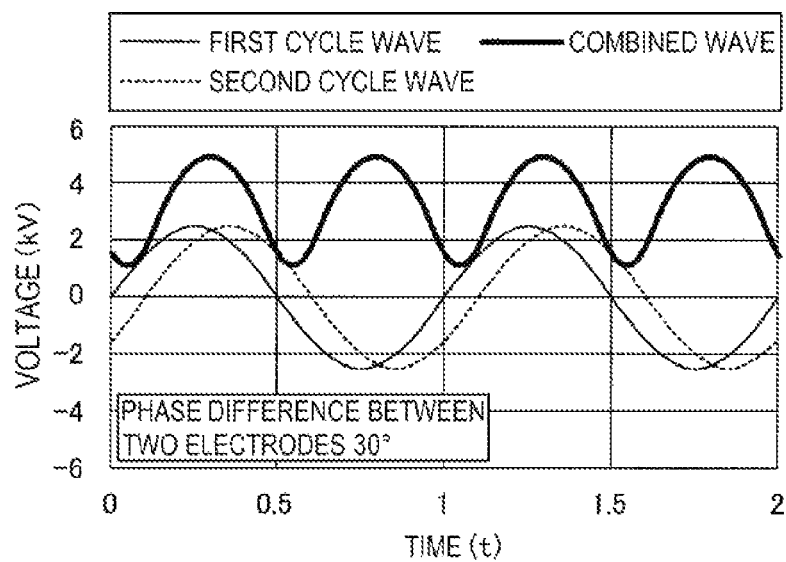
FIG. 7B is a graph illustrating a relationship between a time and an attraction voltage in a case where the phase difference of the attraction voltage applied to each attracting electrode is 30° in the substrate support of the second embodiment.
Figure 7C:
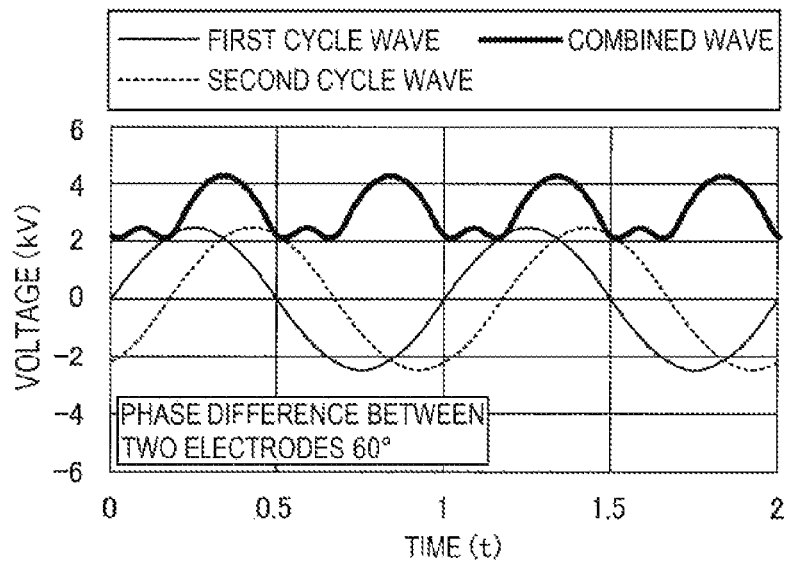
FIG. 7C is a graph illustrating the relationship between a time and an attraction voltage in a case where the phase difference of the attraction voltage applied to each attracting electrode is 60° in the substrate support of the second embodiment.
Figure 7D:
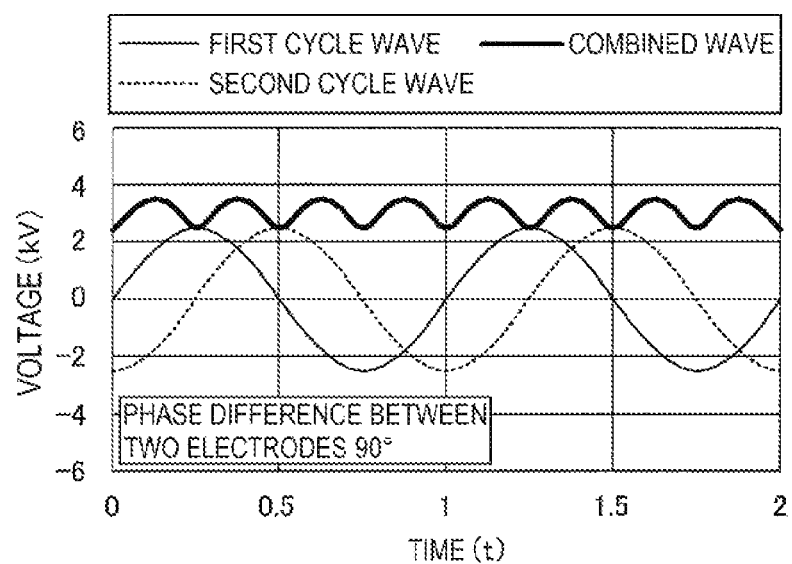
FIG. 7D is a graph illustrating the relationship between a time and an attraction voltage in a case where the phase difference of the attraction voltage applied to each attracting electrode is 90° in the substrate support of the second embodiment.

As illustrated in FIGS. 7B to 7D, in a case where the alternating-current voltage A having a phase different from the phase of the alternating-current voltage B applied to the second central attracting electrode 216a2 is applied to the first central attracting electrode 216a1, there is no timing such that the total voltage applied from the two attracting electrodes to the substrate W becomes 0 V. Therefore, it is possible to suppress the substrate W from being detached from the electrostatic chuck 214.

In particular, as illustrated in FIG. 7D, in a case where the alternating-current voltage A having a phase difference of 90° from the alternating-current voltage B applied to the second central attracting electrode 216a2 is applied to the first central attracting electrode 216a1, the average value of the total voltage applied to the substrate W becomes the highest, and also the variation width of the total voltage may be minimized.

Figure 7E:
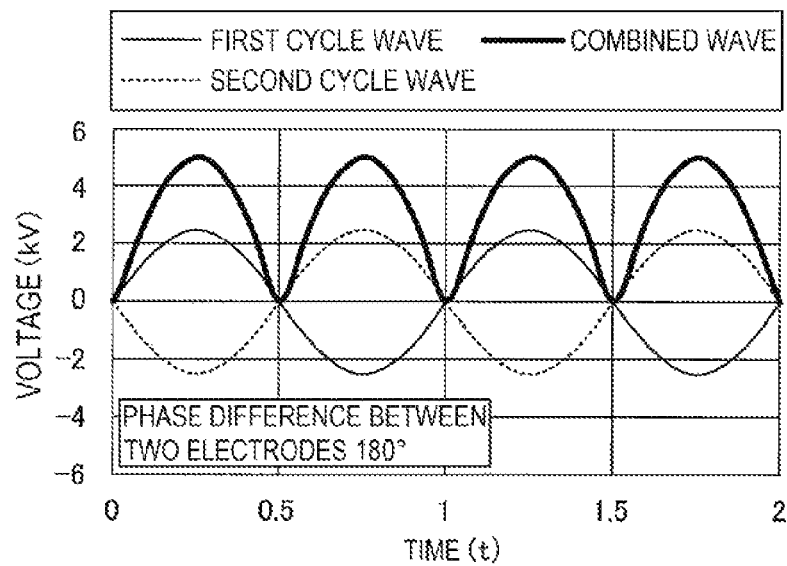
FIG. 7E is a graph illustrating the relationship between a time and an attraction voltage in a case where the phase difference of the attraction voltage applied to each attracting electrode is 180° in the substrate support of the second embodiment.

Meanwhile, as illustrated in FIG. 7E, in a case where the alternating-current voltage A having a phase difference of 180° from the alternating-current voltage B applied to the second central attracting electrode 216a2 is applied to the first central attracting electrode 216a1, there is a timing such that the total voltage applied to the two attracting electrodes become 0 V, as in the case illustrated in FIG. 7A.

As described above, the phase difference between the alternating-current voltages that are applied to the first central attracting electrode 216a1 and the second central attracting electrode 216a2 is preferably greater than 0° and less than 180°, and is more preferably 30° to 150°. Further, this phase difference is set to 90° or in the vicinity thereof, for example, 70° to 110° or 80° to 100°, whereby the substrate W is more stably held by the electrostatic chuck 214.

<Operations and Effects of Technique According to Second Embodiment>

In the substrate support 200 according to the second embodiment, alternating-current voltages having different phases are applied from the attracting power source 217a to the first central attracting electrode 216a1 and the second central attracting electrode 216a2, respectively.

According to the second embodiment, the polarity of the attraction voltage periodically changes, and thus the transfer amount of charges is reset when the polarity changes. Therefore, even in a case where the electrostatic chuck 214 is controlled to a high temperature (for example, 200° C. or more) and the volume resistivity thereof is reduced, an increase in the transfer amount of charges is suppressed, and it is possible to suppress the occurrence of the unstable attraction and holding of the substrate W due to the influence of residual charges or the like.

Further, according to the second embodiment, in a case where an alternating-current voltage having a different phase is applied to each of the first central attracting electrode 216a1 and the second central attracting electrode 216a2, the total voltage applied to the two attracting electrodes does not become 0 V, and it is possible to suppress the substrate W from being detached from the electrostatic chuck 214 during the plasma processing.

Specifically, as described above, the phase difference between the alternating-current voltages to be applied to each of the first central attracting electrode 216a1 and the second central attracting electrode 216a2 is set to be more than 0 degree and less than 180°, or 30° to 150°, whereby the substrate W can be suppressed from being detached from the electrostatic chuck 214.

Further, according to the present embodiment, in addition to the application of an alternating-current voltage having a different phase to each of the first central attracting electrode 216a1 and the second central attracting electrode 216a2, the magnitude of the alternating-current voltages applied from the attracting power source 217a to the first central attracting electrode 216a1 and the second central attracting electrode 216a2 is controlled according to the temperature of the electrostatic chuck 214 as described in the first embodiment, whereby the substrate W can be more stably attracted and detached in the electrostatic chuck 214 during the control to a high temperature.

In the embodiment described above, the case where the alternating-current voltage is applied from the attracting power source 217a to the first central attracting electrode 216a1 and the second central attracting electrode 216a2 has been described by way of example; however, as described above, the application of an alternating-current voltage from the attracting power source 217b to the first peripheral attracting electrode 216b1 and the second peripheral attracting electrode 216b2 can also be performed in the same manner.

In the embodiment described above, a case where the alternating-current voltage is applied from the attracting power source 217 to the first central attracting electrode 216a1, the second central attracting electrode 216a2, the first peripheral attracting electrode 216b1, and the second peripheral attracting electrode 216b2 has been described by way of example; however, the voltage applied to these attracting electrodes is not limited to an alternating-current voltage.

Figure 8:
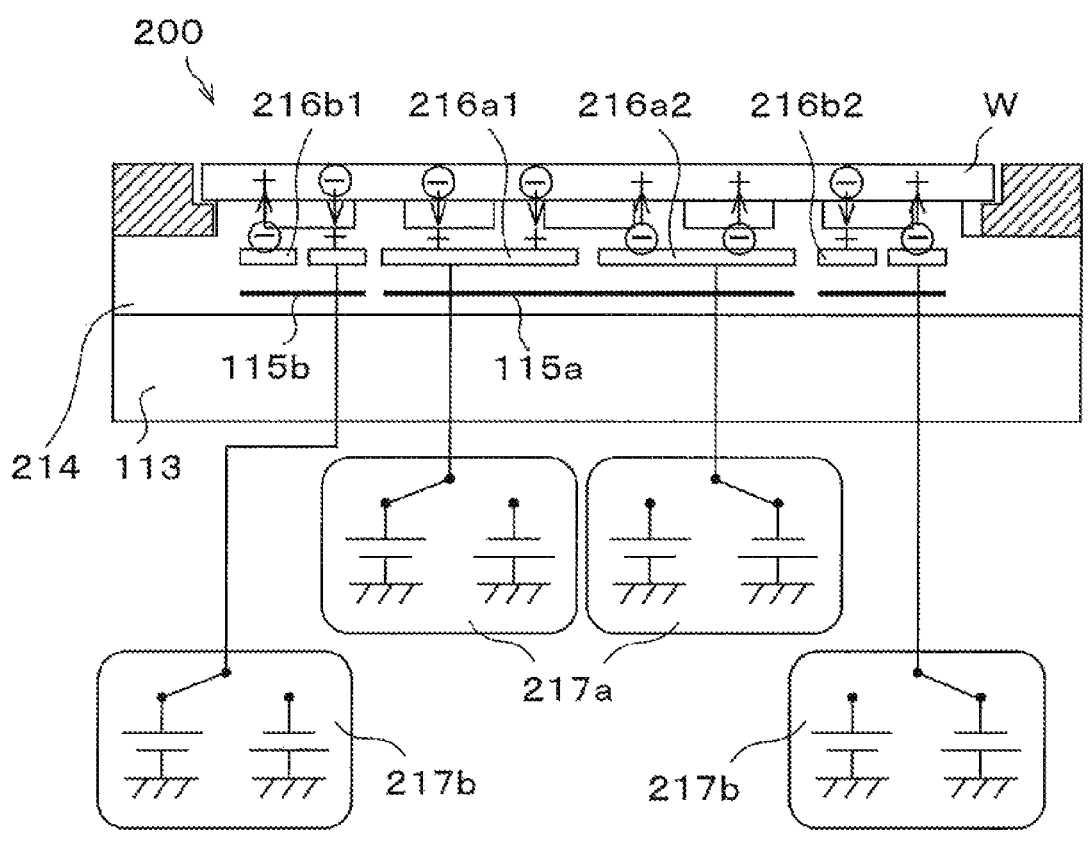
FIG. 8 is an explanatory view illustrating a modification example of a plasma processing system according to the second embodiment.
Figure 8:
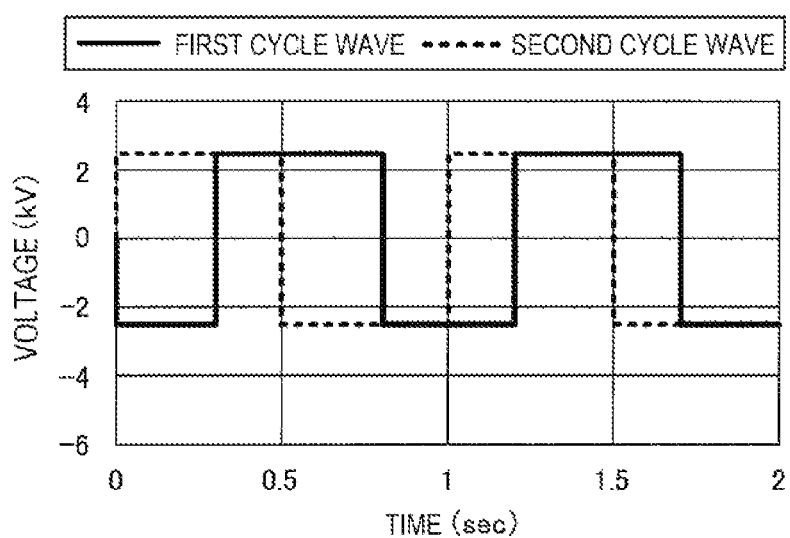

For example, the attraction voltage applied to each attracting electrode may be a direct-current voltage whose magnitude periodically changes. Specifically, as illustrated in FIG. 8, the following configuration is acceptable: a switching type direct-current power source is used as the attracting power sources 217a and 217b, and the magnitude of the voltage applied to each attracting electrode is periodically switched between a first voltage value and a second voltage value having a different polarity from the first voltage value. In this case, the transfer amount of charges can be reset each time the polarities of the attraction voltages applied to the attracting electrodes are periodically switched. Therefore, even in a case where the volume resistivity is reduced by controlling the electrostatic chuck 214 to a high temperature, the substrate W can be stably attracted and detached.

In this case, the phase of an attraction voltage A that is applied to the first central attracting electrode 216a1 may be different from the phase of an attraction voltage B that is applied to the second central attracting electrode 216a2. Further, the phase of an attraction voltage A' that is applied to the first peripheral attracting electrode 216b1 may be different from the phase of an attraction voltage B' that is applied to the second peripheral attracting electrode 216b2. As a result, the total voltage applied to the first central attracting electrode 216a1 and the second central attracting electrode 216a2 or the total voltage applied to the first peripheral attracting electrode 216b1 and the second peripheral attracting electrode 216b2 is suppressed from being 0 V, and it is thus possible to suppress the substrate W from being detached from the electrostatic chuck 214 during the plasma processing.

In the embodiments described above, a case where the substrate support 200 includes the coulomb-type bipolar electrostatic chuck 214 has been described by way of example, but the substrate support 200 may include three or more attracting electrodes for each temperature control region Z of the electrostatic chuck 214. Even in this case, in response to applying an attraction voltage whose magnitude periodically changes for each attracting electrode, the substrate W can be stably attracted and detached to and from the electrostatic chuck 214. Further, in response to applying an attraction voltage having a different phase to each of the attracting electrodes, it is possible to suppress the substrate W from being detached from the electrostatic chuck 214 during the plasma processing.

It shall be understood that the embodiments disclosed herein are illustrative and are not restrictive in all aspects. The embodiment described above may be omitted, replaced, or modified in various forms without departing from the scope and spirit of the appended claims.

The invention claimed is:

1. A substrate support comprising:
   an electrostatic chuck that attracts a substrate, the electrostatic chuck including a dielectric and a plurality of attracting electrodes disposed inside the dielectric, each attracting electrode corresponding to one of a plurality of temperature control regions of the electrostatic chuck;
   a plurality of heater electrodes, each heater electrode corresponding to one of the plurality of temperature control regions and configured to heat the substrate;

an attracting power source for applying a respective attraction voltage to each attracting electrode to attract the substrate; and a heating power source for applying a respective heater voltage to each heater electrode to heat the substrate, wherein the attracting power source controls a magnitude of the attraction voltage applied to each attracting electrode based on a magnitude of the heater voltage applied to the corresponding heater electrode in a same temperature control region to maintain a transfer amount of charges between the substrate and each attracting electrode below a threshold value at which the substrate remains attracted to the electrostatic chuck.

2. The substrate support of claim 1, wherein the attracting power source controls the magnitude of the attraction voltage that is applied to the attracting electrodes such that the transfer amount of the charges becomes constant in the plurality of temperature control regions.

3. The substrate support of claim 1, wherein the electrostatic chuck is bonded on a base, and the plurality of heater electrodes is disposed inside the dielectric and closer to the base than the attracting electrode.

4. The substrate support of claim 1, wherein the attracting electrodes includes a first attracting electrode and a second attracting electrode, and the magnitude of the attraction voltage that is applied to each of the first attracting electrode and the second attracting electrode by the attracting power source changes periodically, and a phase of the attraction voltage that is applied to the first attracting electrode is different from a phase of the attraction voltage that is applied to the second attracting electrode.

5. The substrate support of claim 4, wherein a phase difference between the attraction voltages that are applied to the first attracting electrode and the second attracting electrode is more than 0° and less than 180°.

6. The substrate support of claim 4, wherein a phase difference between the attraction voltages that are applied to the first attracting electrode and the second attracting electrode is 30° or more and 150° or less.

7. The substrate support of claim 4, wherein a waveform of the attraction voltage is a sine wave or a rectangular wave.

8. The substrate support of claim 1, wherein the magnitude of the attraction voltage that is applied to each of the plurality of attracting electrodes by the attracting power source changes periodically, and phases of the attraction voltages that are applied to each of the plurality of attracting electrodes are different from each other.

9. The substrate support of claim 8, wherein a phase difference between any two of the attraction voltages that are applied to the plurality of attracting electrodes is more than 0° and less than 180°.

10. A substrate processing apparatus comprising: a chamber; the substrate support of claim 1 disposed in the chamber; and a controller having a processor and a memory with a computer readable program stored therein.

11. The substrate support of claim 1, wherein the plurality of temperature control regions includes a central region and a peripheral region surrounding the central region, and the attracting power source controls the magnitude of the attraction voltage applied to the attracting electrode in the central region to be different from the magnitude of the attraction voltage applied to the attracting electrode in the peripheral region based on the respective heater voltages applied to the corresponding heater electrodes in the central and peripheral regions.

12. The substrate support of claim 11, wherein the attracting power source controls the magnitude of each attraction voltage applied to each attracting electrode such that the transfer amount of charges between the substrate and each attracting electrode is substantially uniform across the plurality of temperature control regions, based on the respective heater voltages applied to the corresponding heater electrodes.

13. The substrate support of claim 1, wherein the dielectric of the electrostatic chuck includes a plurality of dielectric layers, and the plurality of attracting electrodes and the plurality of heater electrodes are interposed between the dielectric layers.

14. The substrate support of claim 1, further comprising cooling the substrate support during the processing of the substrate using a cooling base bonded to the electrostatic chuck, wherein the controlling the magnitude of the respective attraction voltage accounts for the cooling to maintain the transfer amount of charges below the threshold value.

15. A substrate processing method using a substrate processing apparatus including a substrate support comprising:

an electrostatic chuck that attracts a substrate, the electrostatic chuck including a dielectric and a plurality of attracting electrodes disposed inside the dielectric, each attracting electrode corresponding to one of a plurality of temperature control regions of the electrostatic chuck;

a plurality of heater electrodes, each heater electrode corresponding to one of the plurality of temperature control regions;

an attracting power source for applying a respective attraction voltage to each attracting electrode; and heating power source for applying a respective heater voltage to each heater electrode, the method comprising:

providing the substrate on the electrostatic chuck;

heating the substrate by applying a respective heater voltage to each heater electrode in each temperature control region;

processing the substrate while the substrate is heated; and controlling a magnitude of the attraction voltage applied to each attracting electrode based on a magnitude of the heater voltage applied to the corresponding heater electrode in the same temperature control region during the processing of the substrate to maintain a transfer amount of charges between the substrate and each attracting electrode below a threshold value at which the substrate remains attracted to the electrostatic chuck.

16. The substrate processing method of claim 15, wherein in the controlling the magnitude of the attraction voltage, the magnitude of the attraction voltage that is applied to the attracting electrodes is controlled such that the transfer amount of the charges becomes constant in the plurality of temperature control regions.

17. The substrate processing method of claim 15, wherein in the controlling the magnitude of the attraction voltage, the magnitude of the attraction voltage that is applied to each of the plurality of attracting electrodes by the attracting power source is changed periodically, and the attraction voltage having a different phase is applied to each of the plurality of attracting electrodes.

18. The substrate processing method of claim 17, wherein a phase difference between any two of the attraction voltages that are applied to the plurality of attracting electrodes is more than 0° and less than 180°.

19. The substrate processing method of claim 15, wherein the plurality of temperature control regions includes a central region and a peripheral region surrounding the central region, and the controlling the magnitude of the respective attraction voltage includes applying a first attraction voltage to the attracting electrode in the central region and a second attraction voltage to the attracting electrode in the peripheral region, the first and second attraction voltages having different magnitudes based on the respective heater voltages applied to the corresponding heater electrodes in the central and peripheral regions.

20. The substrate processing method of claim 19, wherein the attracting power source controls the magnitude of each attraction voltage applied to each attracting electrode such that the transfer amount of charges between the substrate and each attracting electrode is substantially uniform across the plurality of temperature control regions, based on the respective heater voltages applied to the corresponding heater electrodes.

21. The substrate processing method of claim 15, wherein the dielectric of the electrostatic chuck includes a plurality of dielectric layers, and the plurality of attracting electrodes and the plurality of heater electrodes are interposed between the dielectric layers.

22. The substrate processing method of claim 15, further comprising cooling the substrate support during the processing of the substrate using a cooling base bonded to the electrostatic chuck, wherein the controlling the magnitude of the respective attraction voltage accounts for the cooling to maintain the transfer amount of charges below the threshold value.

* * * * *